United States Patent [19]

Takahashi

[11] Patent Number: 5,063,933
[45] Date of Patent: Nov. 12, 1991

[54] MAGNETIC RESONANCE IMAGING APPARATUS

[75] Inventor: Ryoichi Takahashi, Tochigi, Japan

[73] Assignee: Kabushiki Kaisha Toshiba, Kawasaki, Japan

[21] Appl. No.: 536,999

[22] Filed: Jun. 13, 1990

Related U.S. Application Data

[63] Continuation of Ser. No. 212,313, Jun. 27, 1988, abandoned.

[30] Foreign Application Priority Data

Jun. 29, 1987 [JP]  Japan .................................. 62-159661

[51] Int. Cl.⁵ .............................................. A61B 5/055
[52] U.S. Cl. ............................. 128/653.5; 128/653 A; 324/322; 248/160
[58] Field of Search ................ 128/653 A, 653 SC; 324/309, 318, 322; 248/160, 274, 104; 378/38, 39, 197

[56] References Cited

U.S. PATENT DOCUMENTS

| | | | |
|---|---|---|---|
| 599,543 | 2/1898 | Whitaker | 248/160 |
| 1,279,803 | 9/1918 | watson | 248/160 |
| 1,566,198 | 12/1925 | Garretson | 378/197 |
| 3,584,822 | 6/1971 | Oram | 248/160 |
| 4,069,995 | 1/1978 | Miller | 248/160 |
| 4,634,980 | 1/1987 | Misic et al. | 324/322 |
| 4,791,372 | 12/1988 | Kirk et al. | 324/318 |
| 4,891,596 | 1/1990 | Mitomi | 324/318 |

FOREIGN PATENT DOCUMENTS 3628035  2/1988  Fed. Rep. of Germany ...... 324/318

*Primary Examiner*—Lee S. Cohen
*Assistant Examiner*—K. M. Pfaffle
*Attorney, Agent, or Firm*—Foley & Lardner

[57] ABSTRACT

In a magnetic resonance imaging apparatus for use in magnetic resonance diagnosis of a patient, there is provided a transmitter-receiver coil affixed to a holding member or bracket which is movably supported by three easily hand bendable, flexible members which rigidly hold the position in which they are bent. The lower extremity of each flexible member is mounted upon a fixing member which can be moved longitudinally along a patient support or table for placement of the coil.

12 Claims, 2 Drawing Sheets

MAGNETIC RESONANCE IMAGING APPARATUS

This application is a continuation of application Ser. No. 07/212,313, filed June 27, 1988, now abandoned.

BACKGROUND OF THE INVENTION

The present invention relates to a magnetic resonance imaging apparatus, and more specifically, to a magnetic resonance imaging apparatus with an improved mechanism for holding a transmitter-receiver coil.

When applying magnetic resonance to the diagnosis of a human disease, a subject is placed in a uniform magnetostatic field, a gradient magnetic field is superposed on the uniform magnetostatic field, and an exciting magnetic field is then applied to produce a magnetic resonance phenomenon. A magnetic resonance signal emitted from the subject is detected, and information concerning the projected area of the subject is obtained. Image information concerning at least one of the proton densities and relaxation time constants of the specific atomic nucleus of the subject can be obtained by subjecting the projected area information to image reconstruction processing. A diagnosis is made on the basis of this image information.

In a magnetic resonance imaging apparatus, a circular surface coil, used as a transmitter-receiver coil, is disposed on the surface of the subject. The exciting magnetic field is produced by the circular surface coil, and the magnetic resonance signal is also detected by the circular surface coil.

In order to dispose the circular surface coil on the surface of the subject, the circular surface coil is maintained on the subject by an adhesive tape or fastened by a band. Accordingly, preparing a diagnosis requires much time and effort, and the subject feels greatly inconvenienced by the attached coil. Moreover, it is very difficult to move the circular surface coil in three-dimensional space when using an adhesive tape or band.

SUMMARY OF THE INVENTION

The object of the present invention is to provide a magnetic resonance imaging apparatus having a transmitter-receiver coil capable of being easily moved and held in three-dimensional space.

According to an aspect of the present invention, there is provided a magnetic resonance imaging apparatus which applies an exciting magnetic field to a subject to produce a magnetic resonance phenomenon, detects a magnetic resonance signal received from the subject, and obtains information on the internal conditions of the subject on the basis of the received signal, comprising:

a coil for applying said exciting magnetic field and/or detecting said magnetic resonance signal received from said subject:

a holding member for holding said coil;

a plurality of flexible members for spatially disposing said coil through said holding member; and a fixing member for fixing said coil through said holding member and said plurality of flexible members to a patient table.

In this magnetic resonance imaging apparatus, a transmitter-receiver coil is held by plurality of flexible members. Accordingly, the apparatus can maintain stiffness with the holding member, and an operator can easily move the transmitter-receiver coil.

DETAILED DESCRIPTION OF THE PREFERRED EMBODIMENT

Figure 1:
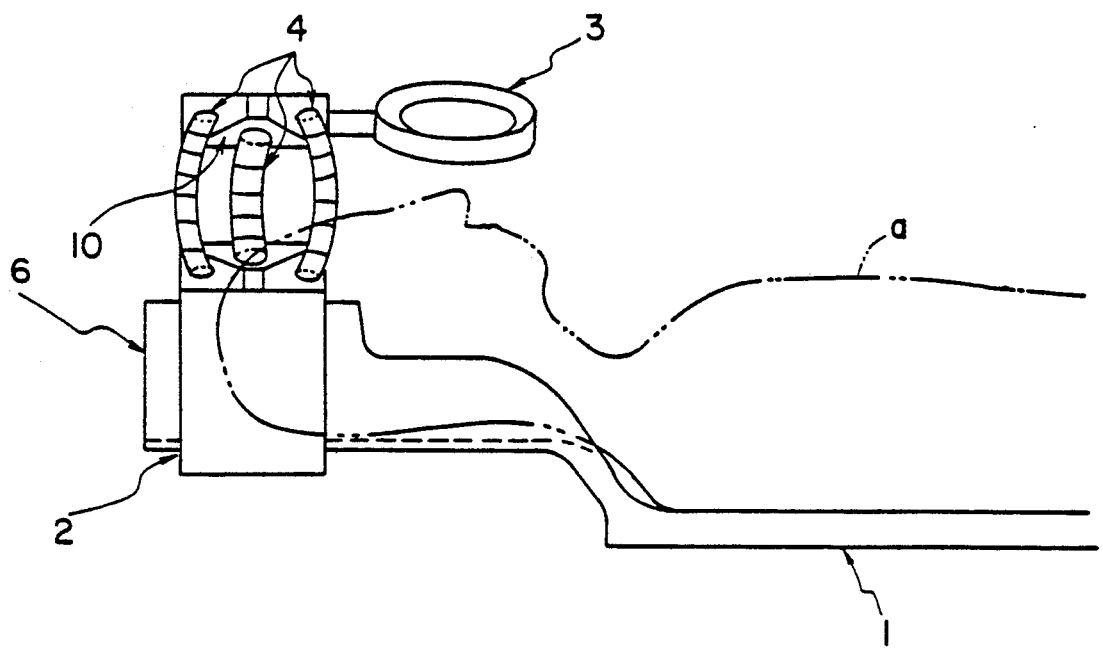
FIG. 1 is a side view of a magnetic resonance imaging apparatus according to an embodiment of the present invention.
Figure 2:
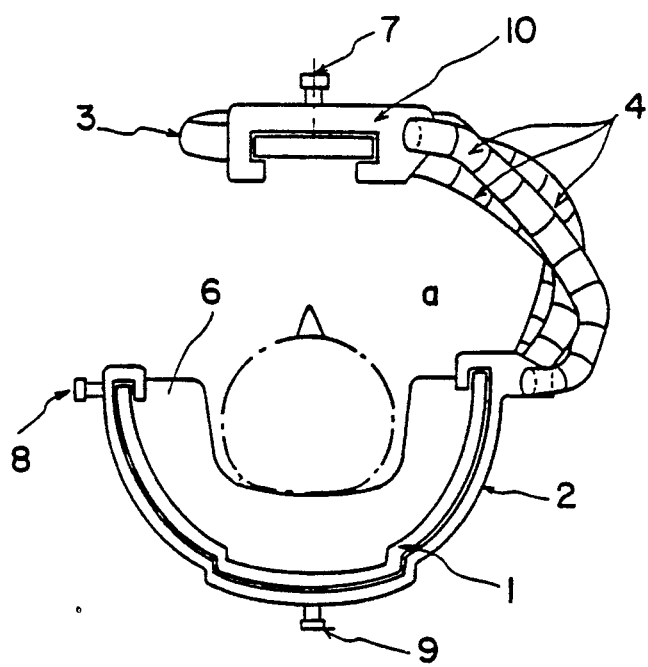
FIG. 2 is a front view of the apparatus of FIG. 1.
Figure 3:
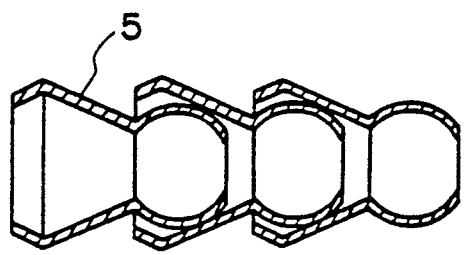
FIG. 3 is a local sectional view of a flexible member.

FIGS. 1 through 3 show a magnetic resonance imaging apparatus according to one embodiment of the present invention. FIG. 1 is a side view of the present invention of a magnetic resonance imaging apparatus. A fixing member 2 is freely fitted to a patient table 1. a subject "a" is laid down on the patient table 1. The fixing member 2 is capable of moving along the longitudinal direction. A circular surface coil 3 produces a magnetic resonance phenomenon and detects a magnetic resonance signal received from the subject "a". The circular surface coil 3 is held by a holding member 10. Three flexible plastic pipes 4 are disposed between the holding member 10 and the fixing member 2. The head of the subject "a" rests on headrest 6. This headrest 6 is fitted on the patient table 1.

FIG. 2 is a front view of the apparatus of FIG. 1. The fixing member 2 is fitted on the outside of the patient table 1. On one side, the fixing member 2 is fixed to the patient table 1 with a screw 9. These screws 8, 9, are capable of manual adjustment. When screws 8, 9 are loosened, the fixing member 2 can be freely moved along the longitudinal direction to a different position. On the other hand, the circular surface coil 3 is fixed to the holding member 10 with a screw or pin 7.

FIG. 3 is a local sectional view of a flexible member. The flexible member is made of plurality of plastic pipes 5.

Figure 4:
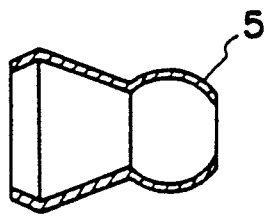
FIG. 4 is a unit sectional view of a flexible member.

FIG. 4 is a unit sectional view of a flexible member. Moreover, spiral connecting pipes can be used as a flexible member.

As both holding member 10 and fixing member 2 are each fitted to the three flexible plastic pipes 4 at predetermined positions, the circular surface coil 3 is not subject to cantilever action.

In order to move the circular surface coil 3, each of the three flexible plastic pipes 4 is bent by hand. The three flexible plastic pipes 4 are easily bent without much effort. A condition for fixing the coil in three-dimensional space is fixing at least three points. As the fixing member 2 uses the three flexible member plastic pipes 4 to fix holding member 10, the surface coil 3 through the holding member 10 contains holding rigidity. Accordingly, the circular surface coil 3 is fixed in three-dimensional space at a position free of the object "a".

In the apparatus constructed in this manner, circular surface coil 3 is held by three flexible plastic pipes 4 and the apparatus can maintain the rigidity of the holding member, while still being easily moved. Moreover, as the fixing member 2 is capable of being moved along the bed the scope of moving a circular surface coil 3 is increased.

What is claimed is:

1. A magnetic resonance imaging apparatus comprising:

means for providing a uniform magnetic field to a subject;

means for providing a gradient magnetic field to said subject;

a table to hold said subject;

coil means for applying an exciting magnetic field to said subject to produce a magnetic resonance phenomenon causing a magnetic resonance signal containing information on internal conditions of said subject and for detecting said signal;

a holding means for holding said coil means;

a plurality of flexible members having sufficient strength to position said holding means and said coil means entirely in space above said table; and a fixing means for fixing said plurality of flexible members to said table.

2. A magnetic resonance imaging apparatus according to claim 1, wherein said plurality of flexible members consists essentially of three flexible members.

3. A magnetic resonance imaging apparatus according to claim 2, wherein said three flexible members comprise plastic pipes.

4. A magnetic resonance imaging apparatus according to claim 1, further comprising:

a plurality of screws for fixing said fixing means to said table, one of said screws being located at a side of said fixing means and another of said screws being located at a base of said fixing means.

5. A magnetic resonance imaging apparatus according to claim 1, further comprising a pin for fixing said coil means to said holding means.

6. A magnetic resonance imaging apparatus according to claim 1, wherein said coil means comprises a circular surface coil.

7. A magnetic resonance imaging apparatus comprising:

means for providing a uniform magnetic field to a subject;

means for providing a gradient magnetic field to said subject;

surface means for placement of said subject;

coil means for applying an exciting magnetic field to said subject and for detecting a magnetic resonance signal from said subject; and means for connecting said coil means to said surface means and for holding said coil means a distance from said surface means sufficient to interpose said subject between said coil means and said surface means, said means for connecting and holding including a plurality of flexible members having sufficient strength to place and maintain said coil means entirely at a special position defining said distance.

8. An apparatus as claimed in claim 7, wherein said coil means comprises a circular surface coil.

9. An apparatus as claimed in claim 7, said means for connecting and holding further comprising:

a holding member to hold said coil means, said plurality of flexible members solely supporting said holding member.

10. An apparatus as claimed in claim 9, said means for connecting and holding further comprising:

a base member to mount said plurality of flexible members on said surface means.

11. An apparatus as claimed in claim 7, wherein said plurality of flexible members consists of three flexible members.

12. An apparatus as claimed in claim 11, wherein said three flexible members comprise plastic pipes.

* * * * *